United States Patent
Kang et al.

(10) Patent No.: US 8,124,516 B2
(45) Date of Patent: Feb. 28, 2012

(54) TRILAYER RESIST ORGANIC LAYER ETCH

(75) Inventors: Sean S. Kang, San Ramon, CA (US);
Sang Jun Cho, Pleasanton, CA (US);
Tom Choi, Santa Clara, CA (US);
Taejoon Han, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 145 days.

(21) Appl. No.: 11/507,862

(22) Filed: Aug. 21, 2006

(65) Prior Publication Data

US 2008/0044995 A1    Feb. 21, 2008

(51) Int. Cl.
*H01L 21/44* (2006.01)

(52) U.S. Cl. ........ 438/597; 438/637; 438/689; 438/725; 438/710; 257/E21.252

(58) Field of Classification Search ................ 438/637, 438/689, 597, 710, 725; 257/E21.252
See application file for complete search history.

(56) References Cited

U.S. PATENT DOCUMENTS

| | | | |
|---|---|---|---|
| 4,376,672 A | 3/1983 | Wang et al. | |
| 4,484,979 A | 11/1984 | Stocker | |
| 4,659,426 A | 4/1987 | Fuller et al. | |
| 4,772,488 A * | 9/1988 | Pinch et al. | 216/13 |
| 4,791,073 A | 12/1988 | Nagy et al. | |
| 4,923,828 A | 5/1990 | Gluck et al. | |
| 5,756,256 A * | 5/1998 | Nakato et al. | 430/272.1 |
| 6,037,266 A * | 3/2000 | Tao et al. | 438/719 |
| 6,258,732 B1 * | 7/2001 | Lin et al. | 438/638 |
| 6,794,293 B2 * | 9/2004 | Li et al. | 438/700 |
| 7,651,942 B2 * | 1/2010 | Huebinger et al. | 438/639 |
| 2004/0161930 A1 * | 8/2004 | Ma et al. | 438/689 |
| 2004/0166669 A1 | 8/2004 | Saito | |
| 2007/0134917 A1 * | 6/2007 | Li et al. | 438/637 |

FOREIGN PATENT DOCUMENTS

| | | |
|---|---|---|
| EP | 0747947 A2 | 12/1996 |
| EP | 1435656 A2 | 7/2004 |

OTHER PUBLICATIONS

Jaeger, "Introduction to Microelectronic Fabrication, vol. V, 2nd ed.", 2002, Prentice Hall, pp. 23-24.*
Search Report dated Dec. 24, 2008 from Singapore Patent Application No. 200705770-6.
Examination Report dated Dec. 24, 2008 from Singapore Patent Application No. 200705770-6.

* cited by examiner

*Primary Examiner* — Alexander Ghyka
*Assistant Examiner* — Leonard Chang
(74) *Attorney, Agent, or Firm* — Beyer Law Group LLP

(57) ABSTRACT

A method of forming dual damascene features in a porous low-k dielectric layer is provided. Vias are formed in the porous low-k dielectric layer. An organic planarization layer is formed over the porous low-k dielectric layer, wherein the organic layer fills the vias. A photoresist mask is formed over the organic planarization layer. Features are etched into the organic planarization layer comprising providing a $CO_2$ containing etch gas and forming a plasma from the $CO_2$ containing etch gas, which etches the organic planarization layer. Trenches are etched into the porous low-k dielectric layer using the organic planarization layer as a mask. The organic planarization layer is stripped.

18 Claims, 7 Drawing Sheets

TRILAYER RESIST ORGANIC LAYER ETCH

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

The photoresist patterns have a critical dimension (CD), which may be the width of the smallest feature. It is desirable to reduce the CD of the features.

SUMMARY OF THE INVENTION

To achieve the foregoing and in accordance with the purpose of the present invention a method of forming dual damascene features in a porous low-k dielectric layer is provided. Vias are formed in the porous low-k dielectric layer. An organic planarization layer is formed over the porous low-k dielectric layer, wherein the organic layer fills the vias. A photoresist mask is formed over the organic planarization layer. Features are etched into the organic planarization layer comprising providing a $CO_2$ containing etch gas and forming a plasma from the $CO_2$ containing etch gas, which etches the organic planarization layer. Trenches are etched into the porous low-k dielectric layer using the organic planarization layer as a mask. The organic planarization layer is stripped.

In another manifestation of the invention, a method of forming dual damascene features in a porous low-k dielectric layer is provided. Vias are formed in the porous low-k dielectric layer. An organic planarization layer is formed over the porous low-k dielectric layer, wherein the organic layer fills the vias. A photoresist mask is formed over the organic planarization layer. Features are etched into the organic planarization layer in a manner which exposes part of the low-k dielectric layer, without damaging the low-k dielectric layer. Trenches are etched into the porous low-k dielectric layer using the organic planarization layer as a mask. The organic planarization layer is stripped.

In another manifestation of the invention, an apparatus for forming trenches in a dielectric layer in which vias have been formed and over which an organic planarization layer has been formed to fill the vias and form a planarized surface over which an oxide cap, BARC, and trench mask has been formed is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a $CO_2$ gas source and a fluorine containing gas source. A controller is controllably connected to the gas source and the at least one electrode and comprises at least one processor and computer readable media. The computer readable media comprises computer readable code for etching the BARC and oxide cap layer comprising computer readable code for providing fluorine containing gas from the fluorine containing gas source into an interior of the plasma processing chamber, computer readable code for transforming the fluorine containing gas into a plasma, and computer readable code for stopping the fluorine containing gas, computer readable code for etching the organic planarization layer, comprising computer readable code for providing a $CO_2$ containing gas from the $CO_2$ gas source, computer readable code for forming a plasma from the $CO_2$ containing gas, and computer readable code for stopping the $CO_2$ containing gas, and computer readable coded for etching trenches into the dielectric layer through the organic planarization layer, comprising computer readable code for providing fluorine containing gas from the fluorine containing gas source into an interior of the plasma processing chamber, and computer readable code for transforming the fluorine containing gas into a plasma.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
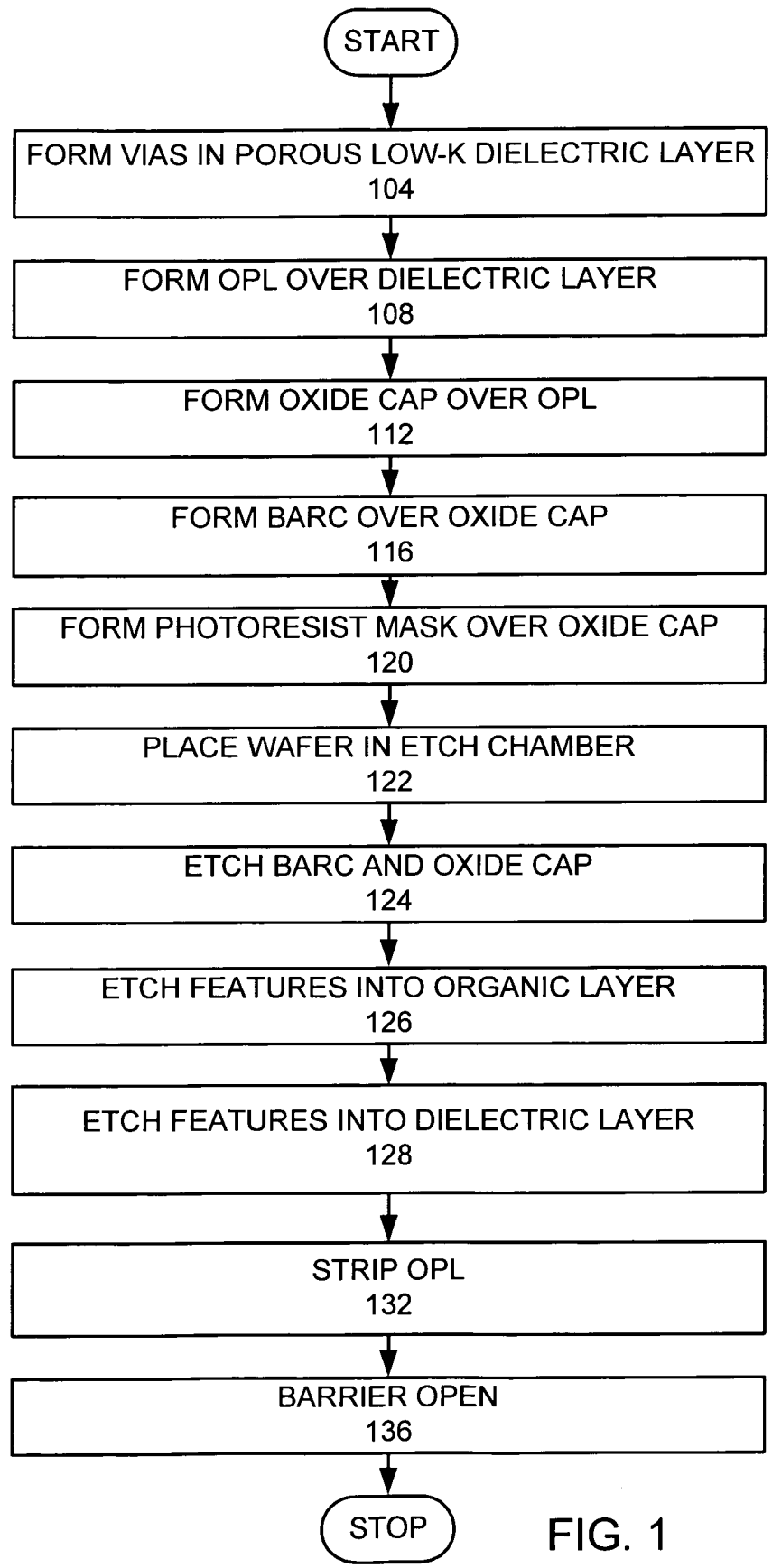
FIG. 1 is a flow chart of a process that may be used in an embodiment of the invention.
Figure 2A:
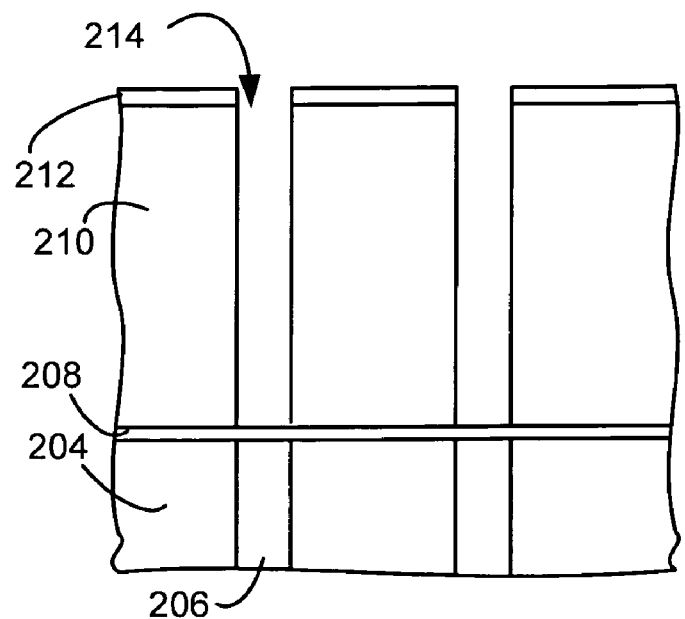
FIGS. 2A-F are schematic cross-sectional views of a wafer processed according to an embodiment of the invention.

To facilitate understanding, FIG. 1 is a flow chart of a process that may be used in an embodiment of the invention. Vias were formed in a porous low-k dielectric layer (step 104). FIG. 2A is a cross sectional views of parts of a M–1 layer of a wafer substrate 204. In this example, the wafer substrate has conductive interconnects 206. A barrier layer 208 may be placed over the wafer substrate 204 and interconnects 206. A porous low-k dielectric layer 210 is placed over the barrier layer 208 and the wafer substrate 204, and a cap layer 212 of a TEOS oxide is placed over the porous low-k dielectric layer 210. Vias 214 have been formed in the porous low-k dielectric layer 210.

Figure 2B:
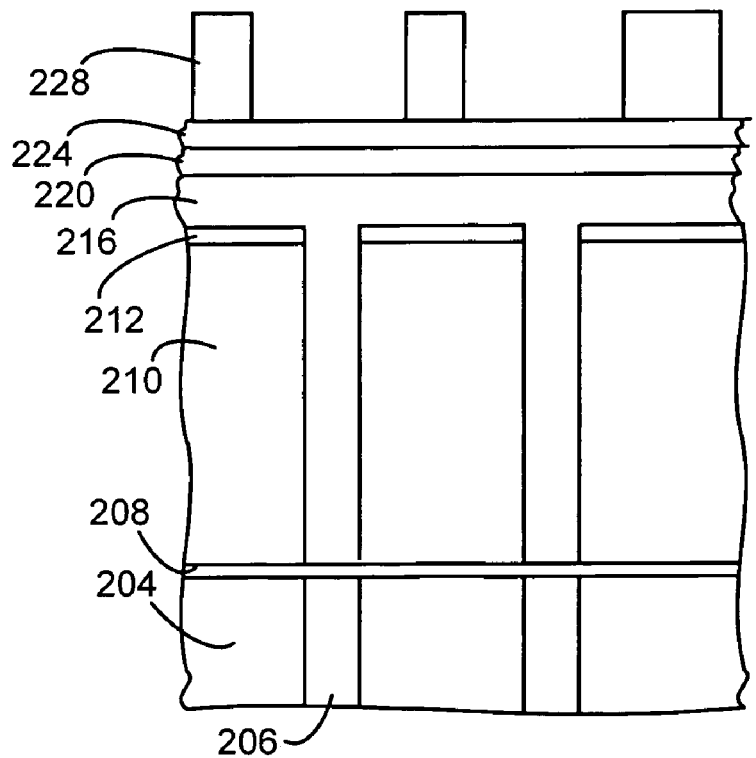

An organic planarization layer (OPL) 216 was formed over the porous low-k dielectric layer 210 (step 108), as shown in FIG. 2B. The organic planarization layer 216 is of an organic material such as polymer, which may be DUV photoresist, or I-line photoresist, which is applied by a process that fills the vias and provides a smooth (planarized) upper surface.

An oxide cap 220 was formed over the OPL 216 (step 112). The oxide cap 220 is made of a silicon oxide material such as TEOS. A bottom antireflective coating (BARC) 224 is formed over the oxide cap 220 (step 116). A photoresist mask 228 was formed over the BARC 224 (step 120). If the OPL 216 is of a photoresist material such as DUV or I-line, in the preferred embodiment the photoresist mask is made of a higher generation photoresist than the OPL 216, so that during the exposure of the photoresist for the photoresist mask, the OPL is not exposed to light at a frequency that would cause the OPL to be patterned.

Figure 4:
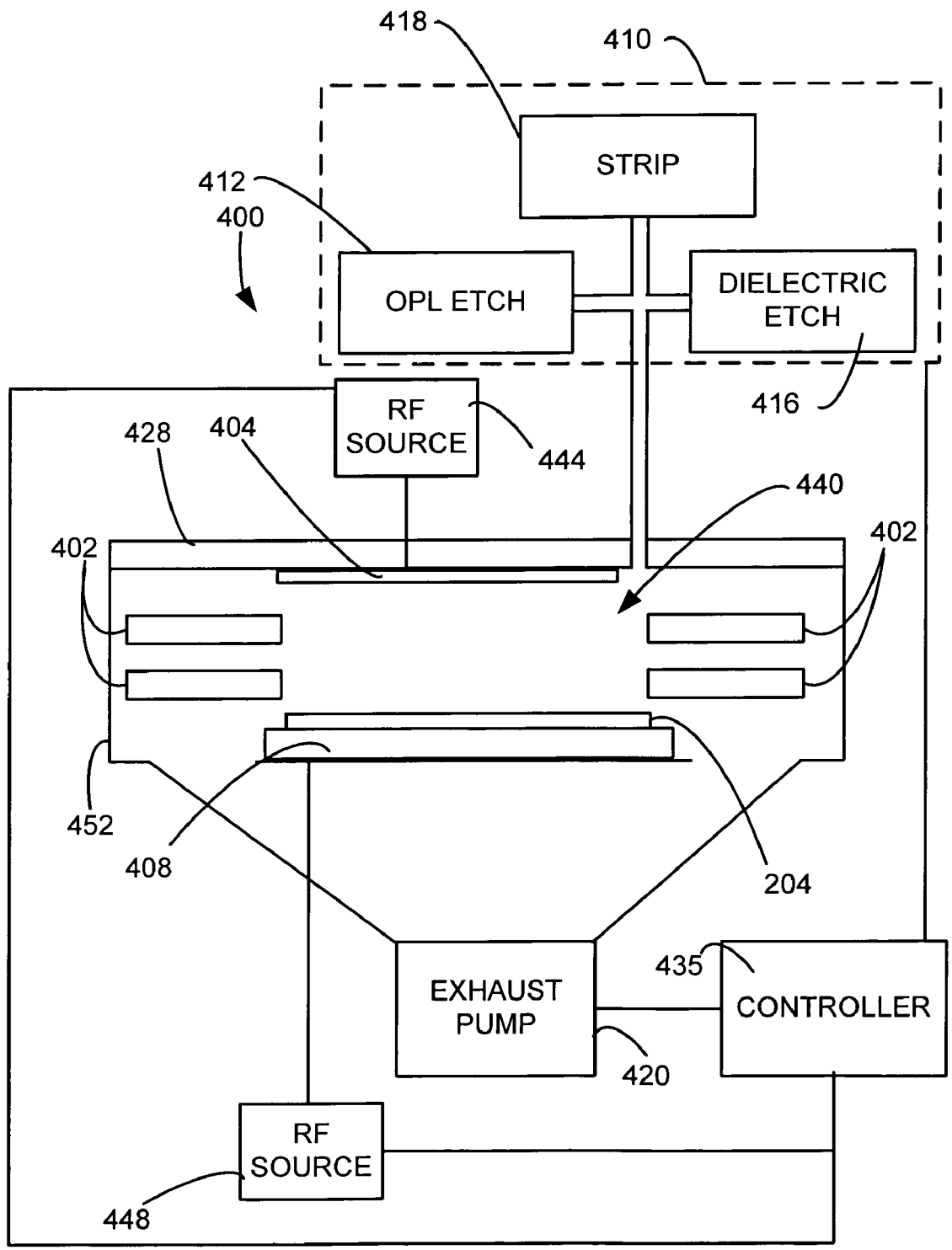
FIG. 4 is a schematic view of a plasma processing chamber that may be used in practicing the invention.

The substrate wafer 204 was put in a plasma processing chamber (step 122). FIG. 4 is a schematic view of a processing chamber 400 that may be used in this embodiment. The plasma processing chamber 400 comprises confinement rings 402, an upper electrode 404, a lower electrode 408, a gas source 410, and an exhaust pump 420. The gas source comprises gas sources such as a OPL etch gas source 412, a dielectric etch gas source 416 and a strip gas source 418 to allow etching, stripping, and other processes to be performed in the same chamber. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 60 MHz power source, a 27 MHz power source, and a 2 MHz power source. Different combinations of connecting RF power to the electrode are possible. In the case of Lam Research Corporation's 2300Exelan Flex45, made by LAM Research Corporation™ of Fremont, Calif., which may be used in a preferred embodiment of the invention, 60 MHz, 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410.

Figure 5A:
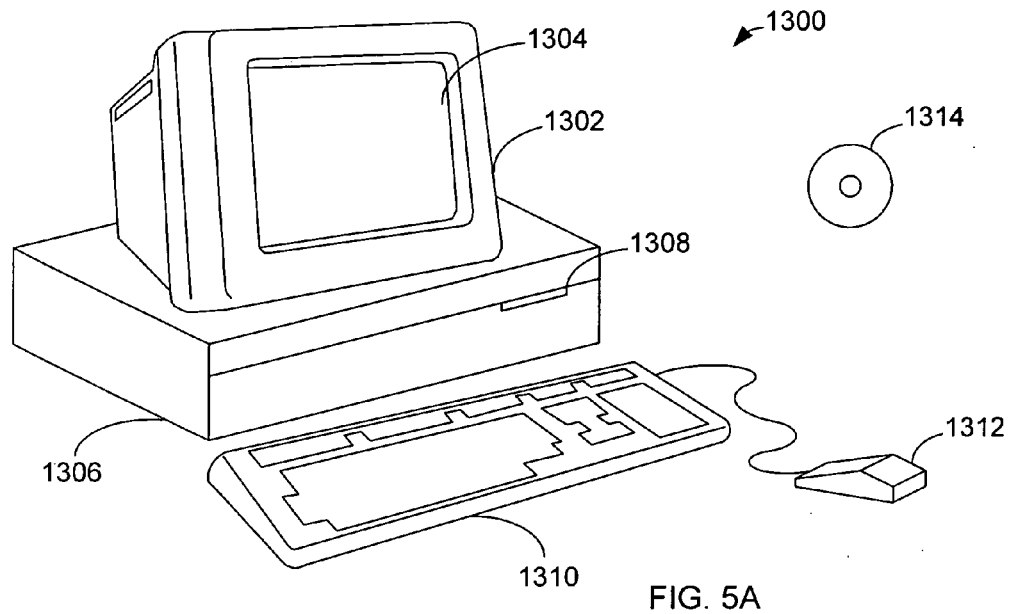
FIGS. 5A-B illustrate a computer system, which is suitable for implementing a controller used in embodiments of the present invention.
Figure 5B:
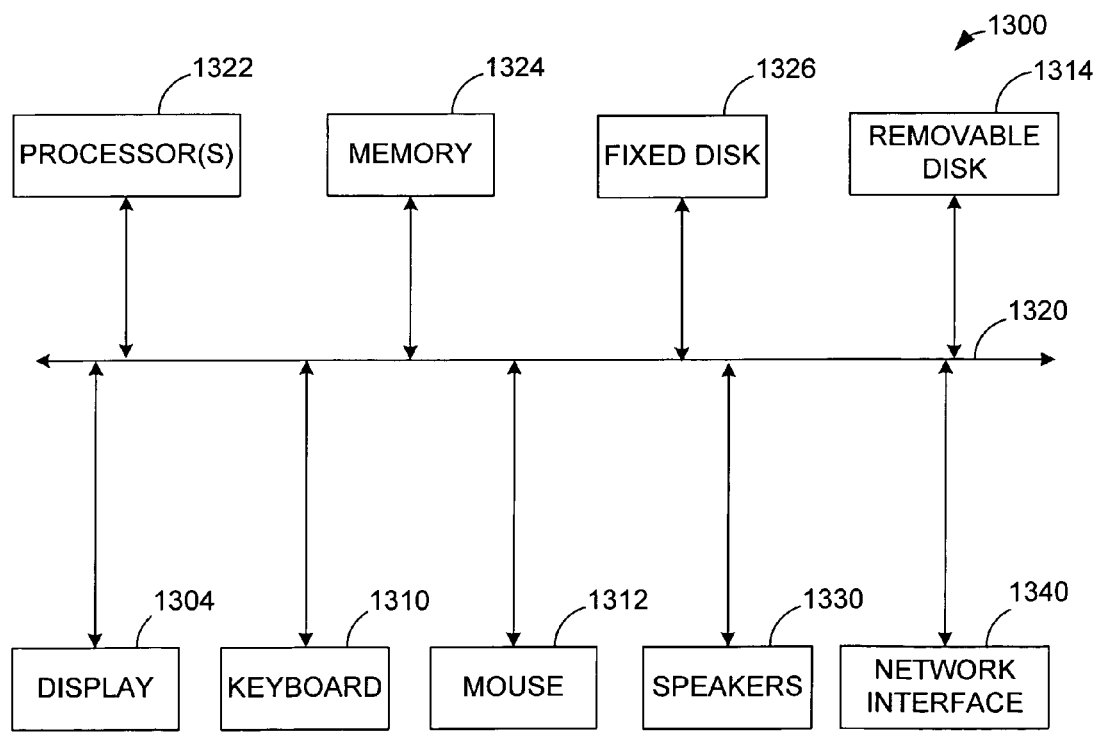

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The BARC 224 and oxide cap 220 are etched and opened (step 124). This is may be done by using a fluorine containing gas, such as a fluorocarbon, such as a $CF_4$ based etch gas which is formed into a plasma. This single $CF_4$ based etch may be used to etch both the BARC 224 and oxide cap 220.

Figure 3:
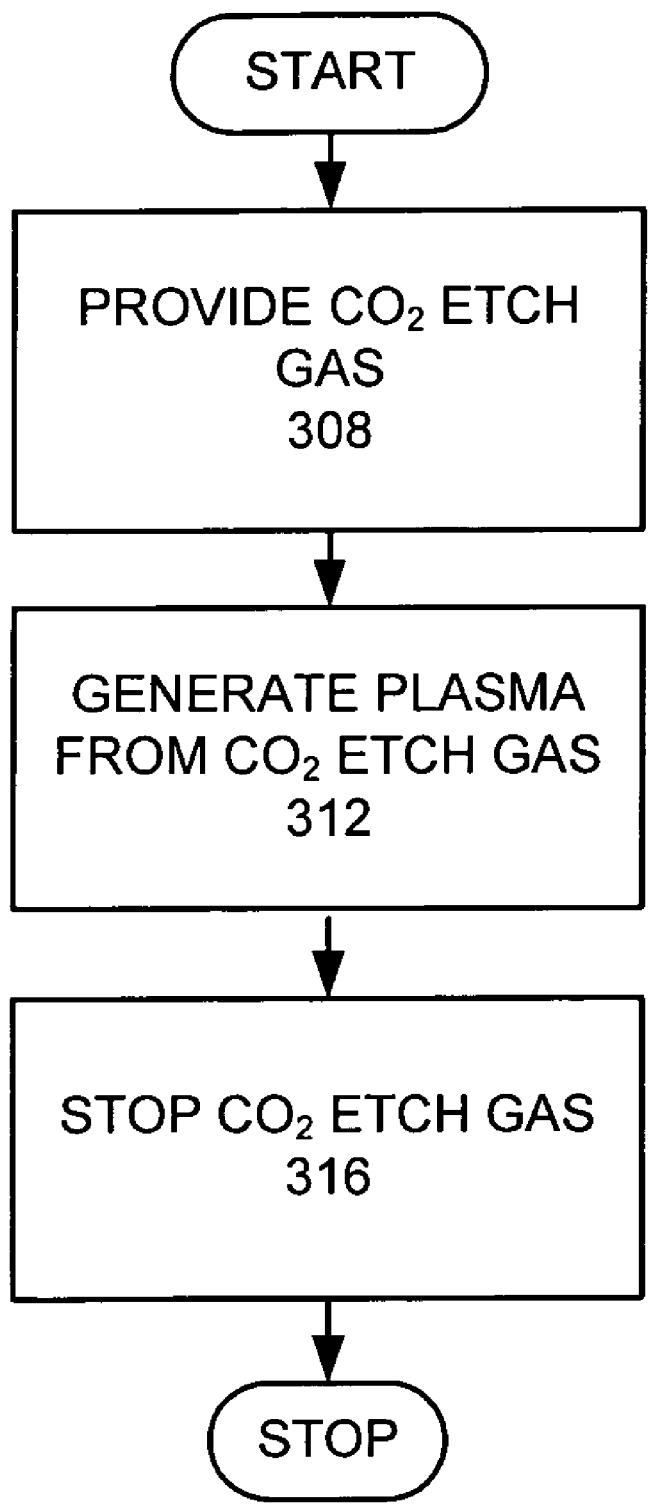
FIG. 3 is a more detailed flow chart of the step of etching features into the organic layer.

Features were etched into the OPL 216 (step 126). FIG. 3 is a more detailed flow chart of a more step of etching features into the OPL used in a preferred embodiment of the invention.

A $CO_2$ etch gas was provided into the interior 404 of the chamber (step 308). Preferably, the $CO_2$ etch gas is at least one of pure or substantially pure $CO_2$ and a mixture consisting of CO and $CO_2$. Therefore, the $CO_2$ etch gas is $O_2$ and $O_3$ free. A plasma is generated from the $CO_2$ etch gas (step 312). In an example recipe, a pressure of 10 mTorr is provided. 800 Watts at 60 MHz is provided. A $CO_2$ etch gas consisting essentially of 150 sccm $CO_2$ is provided. The RF power converts the $CO_2$ etch gas into a plasma with sufficient power to etch the OPL.

Figure 2C:
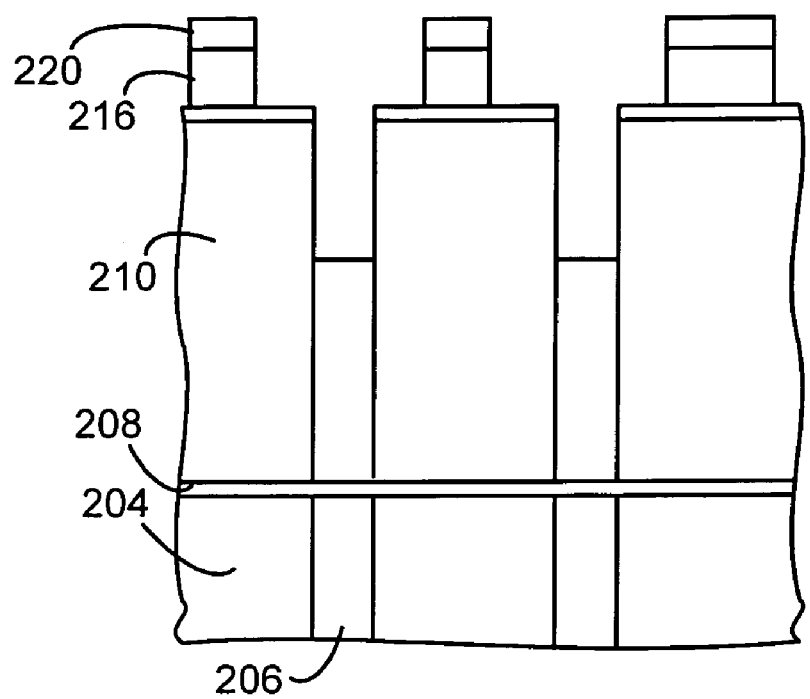

When the etch of the OPL was complete, as shown in FIG. 2C, the $CO_2$ etch gas is stopped (step 316). In this example, the photoresist mask and BARC are etched away during the etch of the OPL. In the preferred embodiment, during the OPL etch, all of the photoresist mask 228 and BARC 224 is etched away and only the oxide cap 220 will remain due to organic nature of the photoresist mask and BARC, which are similar to OPL layer. The oxide cap 220 acts as a new mask layer for OPL etch. During the OPL etch some of the OPL in the vias is etched away, so that some of the porous low-k dielectric is exposed. This is preferred to help prevent fencing.

Figure 2D:
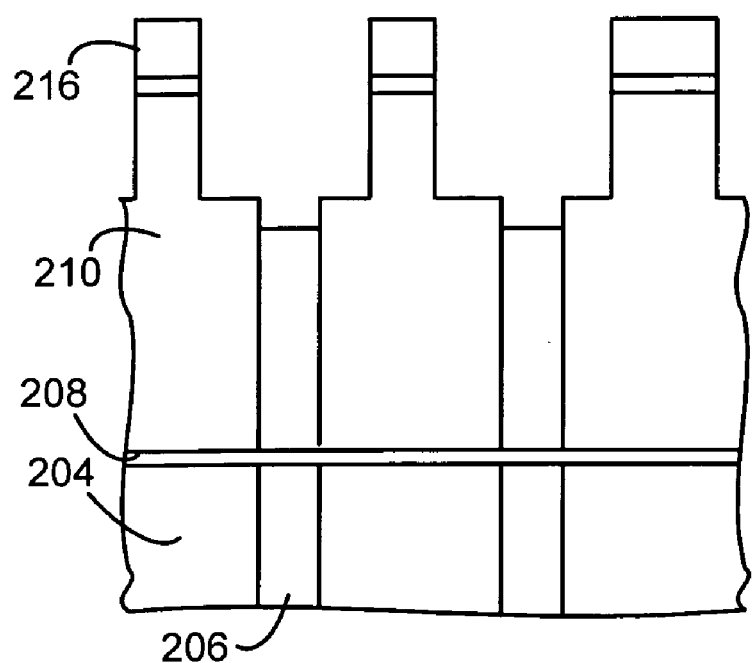

Features were etched into the porous low-k dielectric layer 210 using the OPL 216 as an etch mask (step 128), as shown in FIG. 2D. In the preferred embodiment, the features etched into the porous low-k dielectric layer 210 are trenches for the previously formed vias. An example recipe for this etch provides a pressure of 80 mTorr. 400 Watts at 60 MHz is provided. A porous low-k dielectric etch gas comprising 150 sccm $CF_4$ and 50 sccm $CHF_3$ is provided. It should be noted that the porous low-k dielectric etch gas is different from the OPL etch gas, since the porous low-k dielectric etch gas does not consist of one of $CO_2$ or a $CO_2$ and CO mixture. In other embodiments, other fluorine containing gases are used to etch the porous low k dielectric. More generally, halogen containing gases are used to etch the porous low k dielectric layer. During this step, the oxide cap layer is etched away.

Figure 2E:
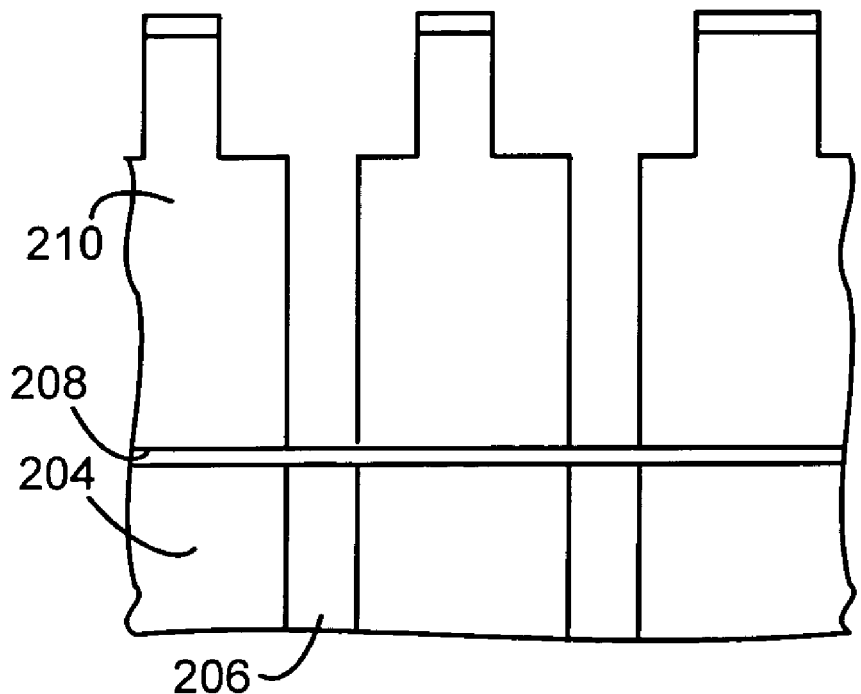
Figure 2F:
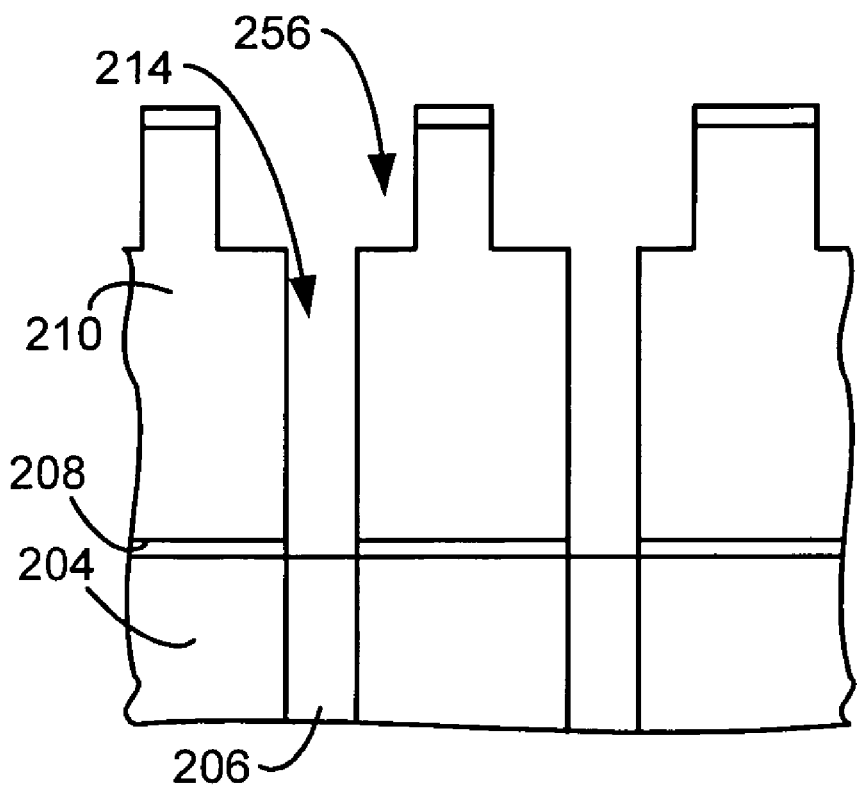

The OPL was then stripped (step 132), as shown in FIG. 2E. A $CO_2$ containing gas may be used to strip the OPL. The barrier layer 208 was opened (step 136). A resulting dual damascene structure with vias 214 and trenches 256 was formed, where the trenches 256 were etched using the OPL as a mask. The substrate is then removed from the etch chamber. In this embodiment the same etch chamber is used for etching the BARC and oxide cap, etching the OPL layer, etching the low-k dielectric layer, stripping the OPL, and opening the barrier layer.

Prior art processes caused the porous low-k dielectric layer to be damaged, which increased the k value. Several steps are performed on the low-k dielectric layer to complete the structure, so that it was not known which step caused the low-k dielectric layer damage. It is believed that it would not be obvious that this damage is caused during the OPL etch. The invention uses $CO_2$ to etch the OPL to avoid etchants that would damage the porous low-k dielectric layer, which is exposed during the OPL etch.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method of forming dual damascene features in a porous low-k dielectric layer, comprising:
    forming vias in the porous low-k dielectric layer;
    forming an organic planarization layer over the porous low-k dielectric layer, wherein the organic layer fills the vias;
    forming a photoresist mask over the organic planarization layer;
    etching features into the organic planarization layer, further comprising:
        providing an etch gas, consists essentially of $CO_2$ or a mixture of $CO_2$ and CO; and
        forming a plasma from the $CO_2$ containing etch gas, which etches the organic planarization layer and exposes part of the porous low-k dielectric layer without damaging the porous low-k dielectric layer;
    etching trenches into the porous low-k dielectric layer using the organic planarization layer as a mask, wherein some of the organic planarization layer remains in the vias after etching trenches into the porous low-k dielectric layer; and
    stripping the organic planarization layer, wherein the organic planarization layer is removed from the vias during the stripping the organic planarization layer.

2. The method, as recited in claim 1, wherein the etching features into the porous low-k dielectric layer comprises providing a dielectric etch gas that is different from the etch gas and is $CO_2$ and CO free.

3. The method, as recited in claim 1, wherein the etching features into the porous low-k dielectric layer comprises providing a fluorine containing gas and transforming the fluorine containing gas into a plasma.

4. The method, as recited in claim 3, further comprising:
    forming an oxide cap layer over the organic planarization layer; and
    forming a BARC over the oxide cap layer, wherein the photoresist mask is formed over the BARC.

5. The method, as recited in claim 4, further comprising opening a barrier layer below the porous low-k dielectric layer.

6. The method, as recited in claim 5, further comprising etching features into the BARC and oxide cap layer in a single step before etching features into the organic planarization layer, comprising:
    providing a fluorine containing gas; and
    transforming the fluorine containing gas into a plasma.

7. The method, as recited in claim 1, wherein the etch gas consists essentially of $CO_2$.

8. The method, as recited in claim 7, wherein the etching features into the porous low-k dielectric layer comprises providing a dielectric etch gas that is different from the $CO_2$ containing gas and is $CO_2$ and CO free.

9. The method, as recited in claim 7, wherein the etching features into the porous low-k dielectric layer comprises providing a fluorine containing gas and transforming the fluorine containing gas into a plasma.

10. The method, as recited in claim 9, further comprising:
    forming an oxide cap layer over the organic planarization layer; and forming a BARC over the oxide cap layer, wherein the photoresist mask is formed over the BARC.

11. The method, as recited in claim 10, further comprising opening a barrier layer below the porous low-k dielectric layer.

12. The method, as recited in claim 11, further comprising etching features into the BARC and oxide cap layer in a single step before etching features into the organic planarization layer, comprising:
   providing a fluorine containing gas; and
   transforming the fluorine containing gas into a plasma.

13. The method, as recited in claim 12, wherein the etching features into the organic planarization layer removes the BARC.

14. The method, as recited in claim 1, wherein the photoresist mask is formed from a positive photoresist.

15. The method, as recited in claim 1, wherein the etching features into the organic planarization layer uses a process gas that consists essentially of the etch gas.

16. The method, as recited in claim 15, wherein the process gas is free of any inert gases.

17. The method, as recited in claim 1, wherein the organic planarization layer that remains in the vias after etching trenches forms via plugs.

18. A method of forming dual damascene features in a porous low-k dielectric layer, comprising:
   forming vias in the porous low-k dielectric layer;
   forming an organic planarization layer over the porous low-k dielectric layer, wherein the organic layer fills the vias;
   forming a photoresist mask over the organic planarization layer;
   etching features into the organic planarization layer in a manner which exposes part of the low-k dielectric layer, without damaging the porous low-k dielectric layer, wherein the etching features only uses a gas mixture consisting essentially of $CO_2$ or a mixture of $CO_2$ and CO, and is $O_2$ and $O_3$ free;
   etching trenches into the porous low-k dielectric layer using the organic planarization layer as a mask, wherein some of the organic planarization layer remains in the vias after etching trenches into the porous low-k dielectric layer; and
   stripping the organic planarization layer.

* * * * *